(12) United States Patent
Hashii

(10) Patent No.: US 10,477,709 B2
(45) Date of Patent: Nov. 12, 2019

(54) HOUSING AND RUBBER PLUG FOR POWER CONVERSION EQUIPMENT

(71) Applicant: Mitsubishi Electric Corporation, Tokyo (JP)

(72) Inventor: Naoya Hashii, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/077,307

(22) PCT Filed: Jun. 7, 2016

(86) PCT No.: PCT/JP2016/066824
§ 371 (c)(1),
(2) Date: Aug. 10, 2018

(87) PCT Pub. No.: WO2017/212535
PCT Pub. Date: Dec. 14, 2017

(65) Prior Publication Data
US 2019/0090368 A1    Mar. 21, 2019

(51) Int. Cl.
*H05K 5/02*    (2006.01)
*H02M 1/00*    (2006.01)
(Continued)

(52) U.S. Cl.
CPC .......... *H05K 5/0217* (2013.01); *H02M 1/00* (2013.01); *H05K 5/0239* (2013.01); *H05K 5/03* (2013.01); *H05K 5/069* (2013.01); *H05K 7/1432* (2013.01)

(58) Field of Classification Search
CPC .... H05K 5/0247; H05K 5/069; H05K 7/1432; H05K 5/03; H05K 5/061; H05K 5/0217; H05K 5/0239; H05K 5/06; H02M 1/00
See application file for complete search history.

(56) References Cited

U.S. PATENT DOCUMENTS 7,500,459 B2 *  3/2009  Koji .................... F16L 5/10
                                           123/195 C
10,058,002 B2 *  8/2018  Hashii ................. H05K 5/0247
(Continued)

FOREIGN PATENT DOCUMENTS

JP    2011-163148 A    8/2011
JP    2015-066021 A    4/2015

OTHER PUBLICATIONS

International Search Report for PCT/JP2016/066824, dated Aug. 23, 2016.

*Primary Examiner* — James Wu
(74) *Attorney, Agent, or Firm* — Sughrue Mion, PLLC; Richard C. Turner

(57) ABSTRACT

A rubber plug for closing each service hole has a cylindrical seal surface to be fitted in the service hole, and a flange to be brought into contact with an outer surface of the housing. The rubber plug has a cylindrical cup-shaped cored bar inside. The cored bar has a disc-shaped flange-portion cored bar, outside the housing, which is greater in a radial direction than a cylindrical portion of the service hole. The cored bar has a convex portion in a cylindrical-cup bottom of a recess, of the rubber plug, which is formed inward of the housing. The convex portion is coaxial with the cylindrical seal surface and projects toward an outward direction of the housing. A lip seal to be brought into contact with the housing is provided at a surface of the flange.

4 Claims, 5 Drawing Sheets

(51) Int. Cl.
*H05K 5/06* (2006.01)
*H05K 7/14* (2006.01)
*H05K 5/03* (2006.01)

(56) References Cited

U.S. PATENT DOCUMENTS

2012/0126536 A1* 5/2012 Takita .................... H02G 3/22
                                                                      290/2
2018/0042132 A1* 2/2018 Hashii ................ H05K 5/0247

* cited by examiner

HOUSING AND RUBBER PLUG FOR POWER CONVERSION EQUIPMENT

This Application is a National Stage of International Application No. PCT/JP2016/066824 filed Jun. 7, 2016.

TECHNICAL FIELD

The present invention relates to housings and rubber plugs of power conversion equipments. In particular, the present invention relates to a housing and a rubber plug of a power conversion equipment in which the rubber plug is used for closing a service hole for connection of components inside the housing.

BACKGROUND ART

In recent years, in order to improve environmental performance such as fuel consumption of automobiles, automobiles such as electric automobiles, hybrid automobiles, and fuel cell powered automobiles, which utilize electric power as well as conventional internal combustion engines, have been rapidly developed and put on the market. Each of these automobiles is equipped with a power conversion equipment for converting electricity to power. Further, in order to cope with higher output and highly efficient packaging, a water cooling system using engine coolant liquid is the mainstream in cooling heat-generating elements in the power conversion equipment. Along with the water cooling, a housing of the power conversion equipment, which is mounted in an engine room, is required to be vibration proof, waterproof, salt-water proof, and dust proof.

Meanwhile, in order to cope with functional improvement, the housing of the power conversion equipment houses components such as: a water cooling heat sink for cooling heat-generating elements such as switching elements; a control circuit board; a step-up converter; etc. Further, the housing of the power conversion equipment houses components such as: a smoothing capacitor for suppressing ripple current; a terminal block for power supply connection; a terminal block for motor connection; etc. These components are electrically connected by use of high-voltage and low-voltage harnesses and bus bars.

As for the power conversion equipment equipped with many components as described above, in order to realize size/weight reduction, cost reduction, improved vibration proof property, and improved assembly performance, a structure as follows has been proposed. That is, each of components such as a control circuit board is housed in a housing that also serves as a structure material, and housings in which the respective components are housed are fastened to each other. Thereafter, electrical connection is executed by use of service holes of the housings, and finally, the service holes are closed with rubber plugs. Further, each rubber plug has a disc-shaped flange, and the rubber plug is inserted until the flange comes into contact with the housing during assembly, which provides excellent assembly performance (for example, refer to Patent Document 1).

Furthermore, in order to improve sealing performance, a structure has been proposed in which a cylindrical cup-shaped cored bar having a flange projecting inward of the housing is provided inside the rubber plug, to increase and uniformize the surface pressure of a resin that comes into contact with a housing-side cylindrical seal surface, and moreover, a lip seal is provided on a disc-shaped flange (for example, refer to Patent Document 2).

CITATION LIST

Patent Document

Patent Document 1: Japanese Laid-Open Patent Publication No. 2011-163148
Patent Document 2: Japanese Laid-Open Patent Publication No. 2015-066021

SUMMARY OF THE INVENTION

Problems to be Solved by the Invention

As for the housing and the rubber plug of the conventional power conversion equipment disclosed in Patent Document 1 or 2, since the rubber plug is fixed to the housing only by friction force generated between the housing and the resin that is an elastic body, if the cored bar in the flange portion repeatedly expands/contracts more than the cored bar in the cylindrical portion during thermal cycles, the rubber plug performs peristaltic movement, and may be disconnected from the housing depending on the temperature condition.

The present invention has been made to solve the above problem, and an object of the present invention is to provide a housing and a rubber plug of a power conversion equipment, capable of preventing disconnection of a rubber plug due to thermal cycles.

Solution to the Problems

A housing and a rubber plug of a power conversion equipment according to the present invention, the housing is provided with a plurality of service holes at a surface thereof, and the service holes are used for electrical connection of circuits inside the housing of the power conversion equipment. The rubber plug for closing each of the service holes has a cylindrical seal surface to be fitted in the service hole, and a flange to be brought into contact with an outer surface of the housing. The rubber plug has a cylindrical cup-shaped cored bar therein. The cored bar has a disc-shaped flange-portion cored bar outside the housing, and the flange-portion cored bar is greater in a radial direction than a cylindrical portion of the service hole. The cored bar has a convex portion in a cylindrical-cup bottom of a recess of the rubber plug. The recess is formed inward of the housing. The convex portion is coaxial with the cylindrical seal surface, and projects toward an outward direction of the housing. A lip seal to be brought into contact with the housing is provided at a surface of the flange.

A housing and a rubber plug of a power conversion equipment according to the present invention, the housing is provided with a plurality of service holes at a surface thereof, and the service holes are used for electrical connection of circuits inside the housing of the power conversion equipment. The rubber plug for closing each of the service holes has a cylindrical seal surface to be fitted in the service hole, and a flange to be brought into contact with an outer surface of the housing. The rubber plug has a cylindrical cup-shaped cored bar therein. The cored bar has a disc-shaped flange-portion cored bar outside the housing, and the flange-portion cored bar is greater in a radial direction than a cylindrical portion of the service hole. The rubber plug has a cylindrical-cup bottom in a recess thereof formed inward of the housing. A lip seal to be brought into contact with the housing is provided at a surface of the flange. A rib is provided at a surface of the housing, on an outer peripheral side of the flange of the rubber plug. After the rubber plug is mounted in the housing, the rib is bent to an inner diameter side.

A housing and a rubber plug of a power conversion equipment according to the present invention, the housing is provided with a plurality of service holes at a surface thereof, and the service holes are used for electrical connection of circuits inside the housing of the power conversion equipment. The rubber plug for closing each of the service holes has a cylindrical seal surface to be fitted in the service hole, and a flange to be brought into contact with an outer surface of the housing. The rubber plug has a cylindrical cup-shaped cored bar therein. The cored bar has a disc-shaped flange-portion cored bar outside the housing, and the flange-portion cored bar is greater in a radial direction than a cylindrical portion of the service hole. The rubber plug has a cylindrical-cup bottom in a recess thereof formed inward of the housing. A lip seal to be brought into contact with the housing is provided at a surface of the flange. After the rubber plug is mounted in the housing, a cover is attached to the housing so as to cover the rubber plug. The cover is made of a steel sheet plated with molten zinc-aluminum-magnesium alloy. The cover is partially deformed to be brought into contact with the surface of the flange, except for a vertically lower portion of the rubber plug.

A housing and a rubber plug of a power conversion equipment according to the present invention, the housing is provided with a plurality of service holes at a surface thereof, and the service holes are used for electrical connection of circuits inside the housing of the power conversion equipment. The rubber plug for closing each of the service holes has a cylindrical seal surface to be fitted in the service hole, and a flange to be brought into contact with an outer surface of the housing. The rubber plug has a cylindrical cup-shaped cored bar therein. The cored bar has a disc-shaped flange-portion cored bar outside the housing, and the flange-portion cored bar is greater in a radial direction than a cylindrical portion of the service hole. The rubber plug has a cylindrical-cup bottom in a recess thereof formed inward of the housing. A lip seal to be brought into contact with the housing is provided at a surface of the flange. After the rubber plug is mounted in the housing, a cover is attached to the housing through screw fastening so as to cover the rubber plug. The cover is made of an aluminum alloy. The cover is partially deformed to form a convex portion coaxial with the cylindrical seal surface. The convex portion is brought into contact with the entire surface of the flange of the rubber plug.

Effect of the Invention

According to the housing and the rubber plug of the power conversion equipment of the present invention, radial displacement of the cored bar is balanced between outside and inside of the housing during thermal cycles, thereby inhibiting peristaltic movement of the rubber plug to prevent disconnection of the rubber plug.

Since the rubber plug is prevented from being directly hit by high pressure water, high waterproof property can be ensured. Further, the effect of preventing disconnection of the rubber plug due to the flange being caught, and the effect of preventing the rubber plug from being easily disconnected on purpose, are achieved.

DESCRIPTION OF EMBODIMENTS

Hereinafter, embodiment 1 of the present invention will be described with reference to the drawings. In the respective drawings, the same symbols denote the same or equivalent components.

Embodiment 1

Figure 1A:
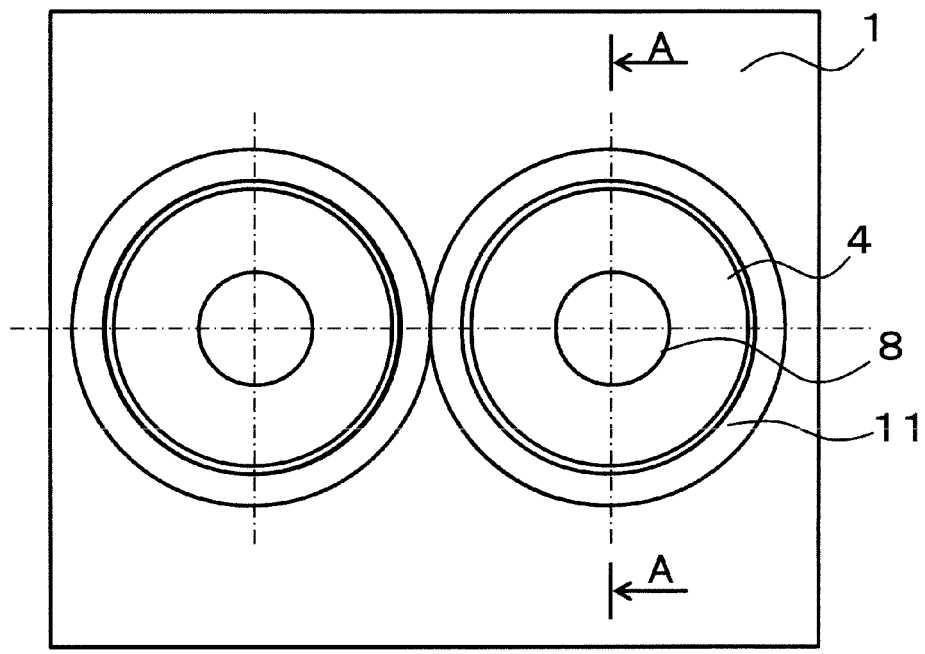
FIG. 1A is a plan view showing a housing and a rubber plug of a power conversion equipment according to embodiment 1 of the present invention.
Figure 1B:
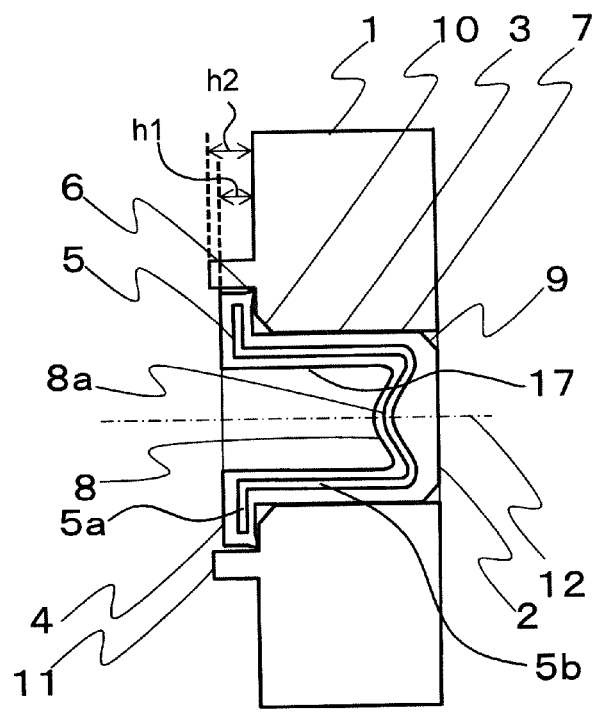
FIG. 1B is a cross-sectional view taken along an A-A line in FIG. 1A.

FIG. 1A is a plan view showing a power conversion equipment according to embodiment 1 of the present invention, as viewed from a side thereof. FIG. 1B is a cross-sectional view taken along an A-A line in FIG. 1A. In FIG. 1A and FIG. 1B, a housing 1 of the power conversion equipment is made of an aluminum die cast from the standpoints of weight reduction and moldability. The housing 1 has a plurality of service holes 3 penetrating the housing 1 from an outer surface thereof toward the inside thereof. Each service hole 3 is provided for electrical connection of electric circuits inside the housing 1 of the power conversion equipment, such as screw fastening between a terminal block and a bus bar, soldering between a substrate and a terminal, or the like. Cylindrical rubber plugs 2 are provided for closing the respective service holes 3. Each rubber plug 2 has: a cylindrical seal surface 7 which fits in the service hole 3; and a flange 4 which is in contact with an outer surface of the housing 1. Inside the cylindrical rubber plug 2, a cylindrical cup-shaped cored bar 5 made of a steel sheet is provided. The cored bar 5 has an annular flange outside the housing 1. The rubber plug 2 has a cylindrical-cup bottom 8 in a recess 17 thereof formed inward of the housing 1. In the cylindrical-cup bottom 8, a convex portion 8a of the cored bar 5 is provided, which is coaxial with the cylindrical seal surface 7 and projects toward an outlet of the housing 1 (outward of the housing 1). The cored bar 5 has: a disc-shaped flange-portion cored bar 5a which is provided outward of the housing 1 and is radially larger than a cylindrical portion of the service hole 3; and a cylindrical-portion cored bar 5b formed inside the rubber plug 2 disposed inside the service hole 3.

The flange 4 in contact with the housing 1 is provided with a lip seal 6 continuous in the circumferential direction.

A taper surface 9 is provided at an end of the rubber plug 2 on the side where no flange 4 is present.

The housing 1 has a taper surface 10 on the side where an insertion port, for the rubber plug 2, of service hole 3 is present. Further, on the outer surface of the housing 1 of the power conversion equipment, a rib 11 projecting outward of the housing 1 is formed on the outer peripheral side of the flange 4 of the rubber plug 2. The rib 11 provided on the housing 1 of the power conversion equipment has a height not less than the thickness of the flange 4 of the rubber plug 2.

The thickness of the flange 4 is a length from a contact surface of the lip seal 6 with the housing 1 to an end surface, of the rubber plug 2, outside the housing. The length is denoted by h1. The height of the rib 11 is a length from the contact surface of the lip seal 6 with the housing 1 to an outer end surface of the rib 11. The length is denoted by h2. Between h1 and h2, a relationship of $h1 \leq h2$ is satisfied. The outer end surface of the rib 11 is orthogonal to an axis 12 of the service hole 3.

As for the housing and the rubber plug of the power conversion equipment according to embodiment 1, since the cored bar 5 is provided inside the rubber plug 2, the surface pressure of the resin contacting the cylindrical seal surface 7 on the housing 1 side is advantageously increased and uniformized. Further, since the lip seal 6 is disposed on the cored-bar-embedded flange 4, the surface pressure of the lip seal 6 is advantageously increased and uniformized. Further, while the flange-portion cored bar 5a is provided inside the flange 4 outside the housing 1, the convex portion 8a of the cored bar 5 is provided in the cylindrical-cup bottom 8 inside the housing 1, whereby radial displacement of the cored bar 5 that expands and contracts during thermal cycles can be equalized between outside and inside of the housing 1. Thus, peristaltic movement of the rubber plug 2 during the thermal cycles is inhibited, thereby preventing disconnection of the rubber plug 2.

Unlike Patent Document 2, a large-diameter portion for preventing disconnection of the rubber plug 2 need not be provided at an end of the rubber plug 2. Therefore, excellent insertion property is obtained when the rubber plug 2 is mounted in the housing 1.

As a result, high waterproof and salt-water-proof properties can be achieved while ensuring thermal cycle resistance and mountability.

Embodiment 2

Figure 2A:
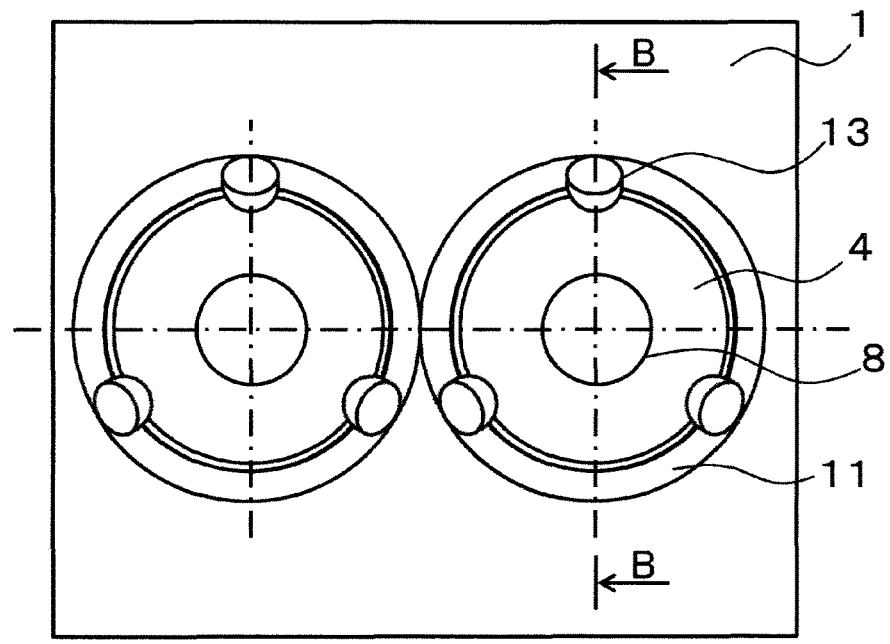
FIG. 2A is a plan view showing a housing and a rubber plug of a power conversion equipment according to embodiment 2 of the present invention.
Figure 2B:
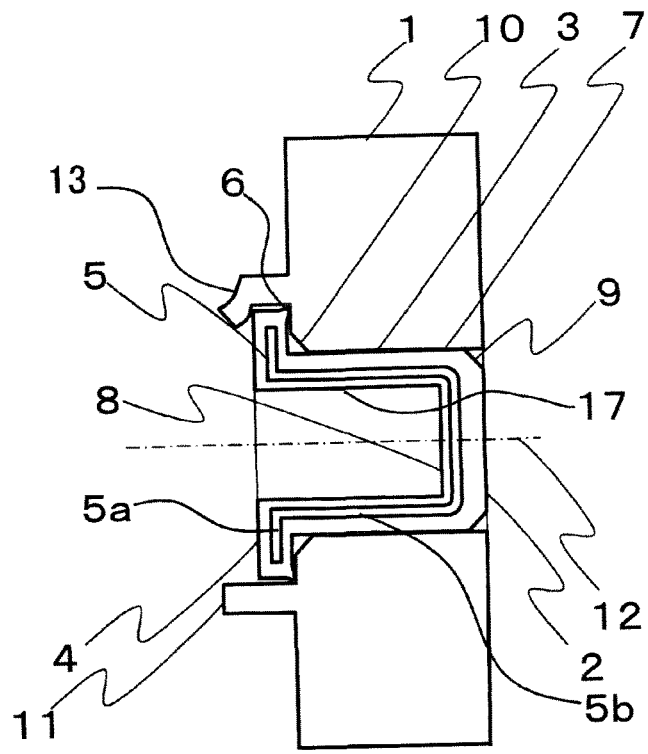
FIG. 2B is a cross-sectional view taken along a B-B line in FIG. 2A.

FIG. 2A is a plan view of a power conversion equipment according to embodiment 2 of the present invention, as viewed from a side thereof. FIG. 2B is a cross-sectional view taken along a B-B line in FIG. 2A. In embodiment 2, the same components as in embodiment 1 are denoted by the same reference numerals, and the description thereof is not given. As shown in FIG. 2A and FIG. 2B, after the rubber plug 2 is mounted in the housing 1, the rib 11 of the housing 1 is bent to the inner diameter side by swaging.

As for the housing and the rubber plug of the power conversion equipment according to embodiment 2, since the rib 11 surrounding the outer periphery of the lip seal 6 is provided, the lip seal 6 is prevented from being directly hit by high pressure water, thereby providing the effect of ensuring high waterproof property. In addition, a bent portion 13 of the rib 11 provides the effect of preventing disconnection of the rubber plug 2 due to peristaltic movement of the rubber plug 2 during the thermal cycles. Further, the bent portion 13 provides the effect of preventing disconnection of the rubber plug 2 due to the flange 4 being caught, and the effect of preventing the rubber plug 2 from being easily disconnected on purpose.

Embodiment 3

Figure 3A:
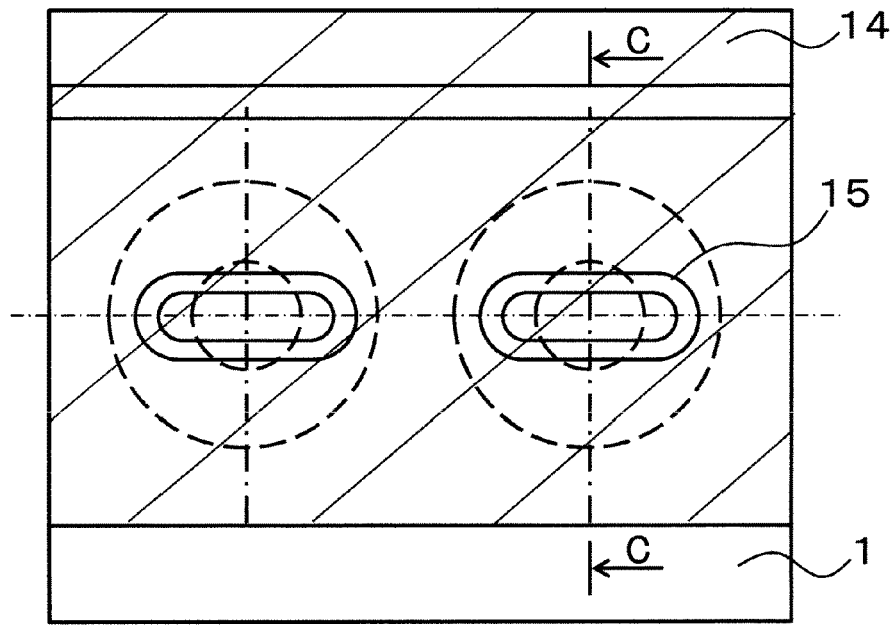
FIG. 3A is a plan view showing a housing and a rubber plug of a power conversion equipment according to embodiment 3 of the present invention, in which a sheet metal cover is disposed on the rubber plug.
Figure 3B:
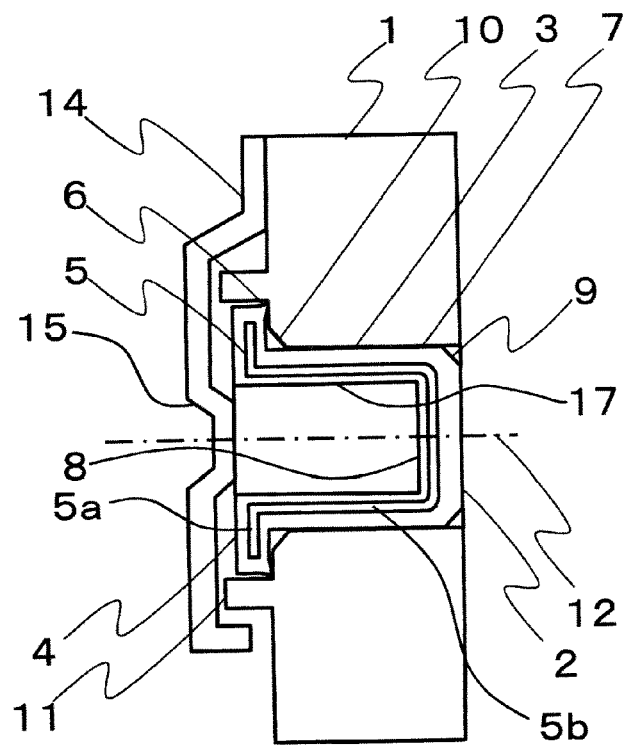
FIG. 3B is a cross-sectional view taken along a C-C line in FIG. 3A.
Figure 4A:
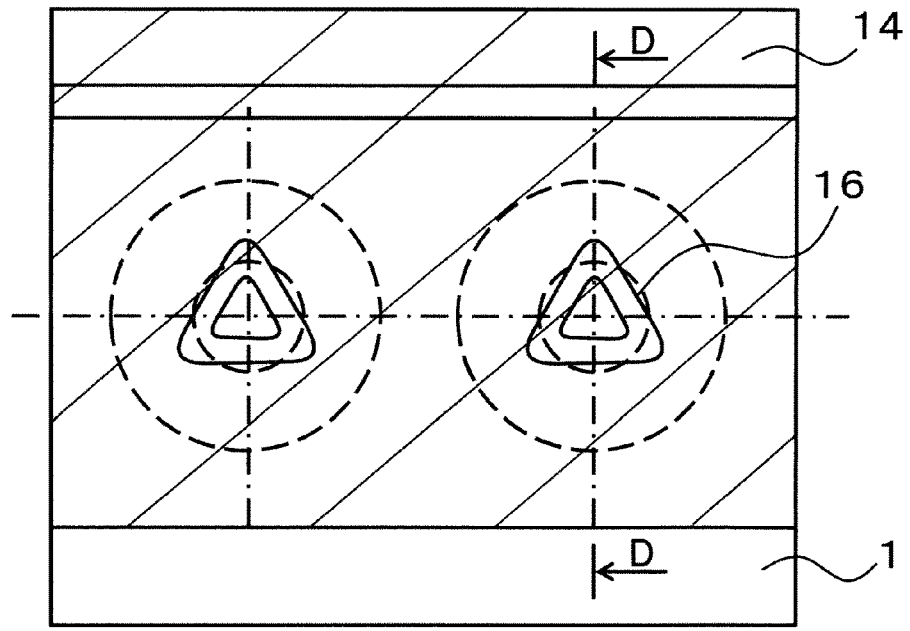
FIG. 4A is a plan view showing the housing and the rubber plug of the power conversion equipment according to embodiment 3 of the present invention, in which a sheet metal cover is disposed on the rubber plug.
Figure 4B:
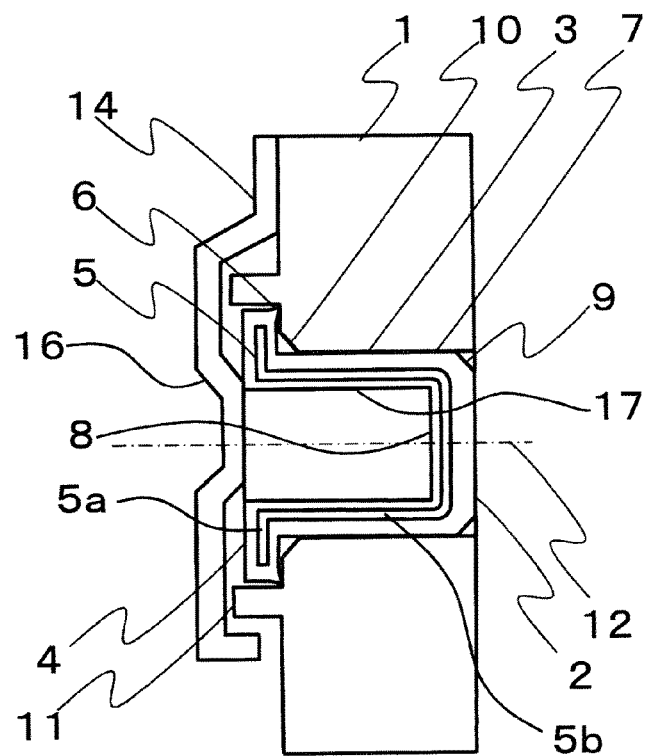
FIG. 4B is a cross-sectional view taken along a D-D line in FIG. 4A.

Each of FIG. 3A and FIG. 4A is a plan view of a power conversion equipment according to embodiment 3 of the present invention, as viewed from a side thereof. FIG. 3B is a cross-sectional view taken along a C-C line in FIG. 3A, and FIG. 4B is a cross-sectional view taken along a D-D line in FIG. 4A. In embodiment 3, the same components as in embodiment 1 are denoted by the same reference numerals, and the description thereof is not given.

As shown in FIG. 3A, FIG. 3B, FIG. 4A, and FIG. 4B, after the rubber plug 2 is mounted in the housing 1, a sheet metal cover 14 is attached to the housing 1 so as to cover the rubber plug 2, and the sheet metal cover 14 is partially deformed so as to bring the sheet metal cover 14 into contact with the end surface of the flange 4, except for a vertically lower portion of the end surface of the flange 4.

As for the housing and the rubber plug of the power conversion equipment according to embodiment 3, since the sheet metal cover 14 is disposed, the rubber plug 2 is prevented from being directly hit by high pressure water, thereby providing the effect of ensuring high waterproof property. In addition, the sheet metal cover 14 provides the effect of preventing disconnection of the rubber plug 2 due to peristaltic movement of the rubber plug 2 during the thermal cycles, the effect of preventing disconnection of the rubber plug 2 due to the flange 4 being caught, and the effect of preventing the rubber plug 2 from being easily disconnected on purpose.

Since the insertion position of the rubber plug 2 becomes stable and the crushing margin of the lip seal 6 becomes stable as designed, high waterproof and salt-water-proof properties can be maintained for a long time. In addition, even when a portion of the housing 1, which is in contact with the lip seal 6, is corroded by salt water and a resultant corrosion product attempts to push up the flange 4 in the direction of disconnecting the rubber plug 2, since a sheet metal draw portion 15 or a sheet metal draw portion 16 of the sheet metal cover 14 holds down the flange 4, reduction in seal surface pressure of the lip seal 6 due to retracting of the rubber plug 2 is advantageously inhibited.

Since the material of the sheet metal cover 14 is a steel sheet plated with a molten zinc-aluminum-magnesium alloy, a dense and highly-adhesive protection film is formed at the plated surface due to the effect of magnesium and aluminum contained in the plated layer. This material is highly resistant to corrosion, and is low in cost. However, under the environment where the sheet metal cover 14 is always in contact with water such as stagnant water, elution of magnesium may cause the protection film to disappear, which may result in early corrosion. Therefore, the sheet metal draw portion 15 or the sheet metal draw portion 16 is brought into contact with the end surface of the flange 4, except for a vertically lower portion of the end surface of the flange 4. Thus, even if water reaches the cylindrical-cup bottom 8 of the rubber plug 2, the water is discharged, thereby preventing the water from being stagnant between the rubber plug 2 and the sheet metal cover 14 for a long time.

Embodiment 4

Figure 5A:
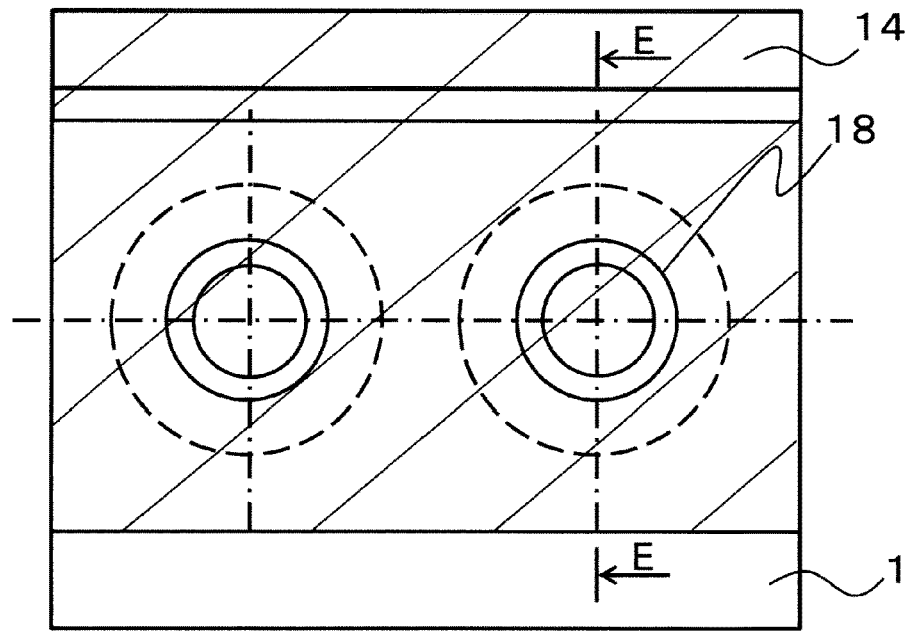
FIG. 5A is a plan view showing a housing and a rubber plug of a power conversion equipment according to embodiment 4 of the present invention, in which a sheet metal cover is disposed on the rubber plug.
Figure 5B:
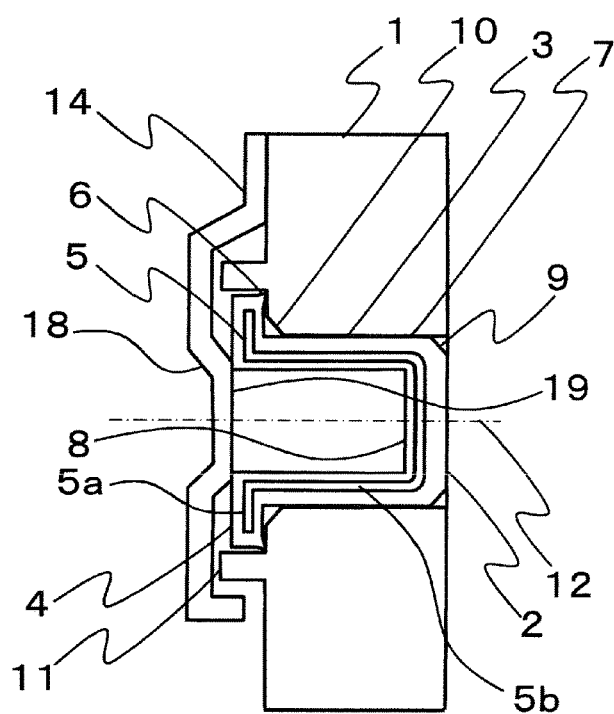
FIG. 5B is a cross-sectional view taken along an E-E line in FIG. 5A.

FIG. 5A is a plan view of a power conversion equipment according to embodiment 4 of the present invention, as viewed from a side thereof. FIG. 5B is a cross-sectional view taken along an E-E line in FIG. 5A. In embodiment 4, the same components as in embodiment 1 and embodiment 3 are denoted by the same reference numerals, and the description thereof is not given.

As shown in FIG. 5A and FIG. 5B, in embodiment 4, a sheet metal draw portion 18 formed by partially deforming the sheet metal cover 14 has a convex shape coaxial with the cylindrical seal surface 7, and is in contact with the entire end surface of the flange 4 of the rubber plug 2. Therefore, as compared with embodiment 3, the insertion position of the rubber plug 2 is maintained more stably, whereby higher waterproof and salt-water-proof properties can be maintained for a long time.

That is, in embodiment 4, the material of the sheet metal cover 14 is an aluminum alloy (e.g., A5052 or A6063), the sheet metal cover 14 is partially deformed to form a convex portion 19 coaxial with the cylindrical seal surface 7, and this convex portion 19 is in contact with the entire surface of the flange 4 of the rubber plug 2.

Since the material of the sheet metal cover 14 is an aluminum alloy, the sheet metal cover 14 is not corroded even when water is stagnant between the rubber plug 2 and the sheet metal cover 14 for a long time.

Since the linear expansion coefficient of the aluminum alloy is close to that of the aluminum die cast (e.g., ADC12) of the housing 1, the difference in thermal expansion between the sheet metal cover 14 and the housing 1 during the thermal cycles is small, whereby the screws used for fixing the sheet metal cover 14 are hardly loosened.

It is noted that, within the scope of the present invention, the above embodiments may be freely combined with each other, or each of the above embodiments may be modified or abbreviated as appropriate.

DESCRIPTION OF THE REFERENCE CHARACTERS 1 housing
2 rubber plug
3 service hole
4 flange
5 cored bar
5a flange-portion cored bar
5b cylindrical-portion cored bar
6 lip seal
7 cylindrical seal surface
8 cylindrical-cup bottom
8a convex portion
9 taper surface
10 taper surface
11 rib
12 service hole axis
13 bent portion
14 sheet metal cover
15 sheet metal draw portion
16 sheet metal draw portion
17 recess
18 sheet metal draw portion
19 convex portion

The invention claimed is:

1. A housing and a rubber plug of a power conversion equipment, the housing being provided with a plurality of service holes at a surface thereof, the service holes being used for electrical connection of circuits inside the housing of the power conversion equipment, wherein
the rubber plug for closing each of the service holes has a cylindrical seal surface to be fitted in the service hole, and a flange to be brought into contact with an outer surface of the housing,
the rubber plug has a cylindrical cup-shaped cored bar therein,
the cored bar has a disc-shaped flange-portion cored bar outside the housing, the flange-portion cored bar being greater in a radial direction than a cylindrical portion of the service hole,
the cored bar has a convex portion in a cylindrical-cup bottom of a recess of the rubber plug, the recess being formed inward of the housing, the convex portion being coaxial with the cylindrical seal surface and projecting toward an outward direction of the housing, and
a lip seal to be brought into contact with the housing is provided at a surface of the flange.

2. A housing and a rubber plug of a power conversion equipment, the housing being provided with a plurality of service holes at a surface thereof, the service holes being used for electrical connection of circuits inside the housing of the power conversion equipment, wherein
the rubber plug for closing each of the service holes has a cylindrical seal surface to be fitted in the service hole, and a flange to be brought into contact with an outer surface of the housing,
the rubber plug has a cylindrical cup-shaped cored bar therein,
the cored bar has a disc-shaped flange-portion cored bar outside the housing, the flange-portion cored bar being greater in a radial direction than a cylindrical portion of the service hole,
the rubber plug has a cylindrical-cup bottom in a recess thereof formed inward of the housing,
a lip seal to be brought into contact with the housing is provided at a surface of the flange,
a rib is provided at a surface of the housing, on an outer peripheral side of the flange of the rubber plug, and
after the rubber plug is mounted in the housing, the rib is bent to an inner diameter side.

3. A housing and a rubber plug of a power conversion equipment, the housing being provided with a plurality of service holes at a surface thereof, the service holes being used for electrical connection of circuits inside the housing of the power conversion equipment, wherein
the rubber plug for closing each of the service holes has a cylindrical seal surface to be fitted in the service hole, and a flange to be brought into contact with an outer surface of the housing,
the rubber plug has a cylindrical cup-shaped cored bar therein,
the cored bar has a disc-shaped flange-portion cored bar outside the housing, the flange-portion cored bar being greater in a radial direction than a cylindrical portion of the service hole,
the rubber plug has a cylindrical-cup bottom in a recess thereof formed inward of the housing,
a lip seal to be brought into contact with the housing is provided at a surface of the flange,
after the rubber plug is mounted in the housing, a cover is attached to the housing so as to cover the rubber plug,
the cover is made of a steel sheet plated with a molten zinc-aluminum-magnesium alloy, and
the cover is partially deformed to be brought into contact with the surface of the flange, except for a vertically lower portion of the rubber plug.

4. A housing and a rubber plug of a power conversion equipment, the housing being provided with a plurality of service holes at a surface thereof, the service holes being used for electrical connection of circuits inside the housing of the power conversion equipment, wherein the rubber plug for closing each of the service holes has a cylindrical seal surface to be fitted in the service hole, and a flange to be brought into contact with an outer surface of the housing, the rubber plug has a cylindrical cup-shaped cored bar therein, the cored bar has a disc-shaped flange-portion cored bar outside the housing, the flange-portion cored bar being greater in a radial direction than a cylindrical portion of the service hole, the rubber plug has a cylindrical-cup bottom in a recess thereof formed inward of the housing, a lip seal to be brought into contact with the housing is provided at a surface of the flange, after the rubber plug is mounted in the housing, a cover is attached to the housing through screw fastening so as to cover the rubber plug, the cover is made of an aluminum alloy, the cover is partially deformed to form a convex portion coaxial with the cylindrical seal surface, and the convex portion is brought into contact with the entire surface of the flange of the rubber plug.

* * * * *